US007034611B2

(12) United States Patent
Oswal et al.

(10) Patent No.: US 7,034,611 B2
(45) Date of Patent: Apr. 25, 2006

(54) MULTISTAGE COMMON MODE FEEDBACK FOR IMPROVED LINEARITY LINE DRIVERS

(75) Inventors: Sandeep Oswal, Karnataka (IN); Bhupendra Sharma, Karnataka (IN); Visvesvaraya Pentakota, Karnataka (IN)

(73) Assignee: Texas Instruments Inc., Dallas, TX (US)

( * ) Notice: Subject to any disclaimer, the term of this patent is extended or adjusted under 35 U.S.C. 154(b) by 0 days.

(21) Appl. No.: 10/855,464

(22) Filed: May 27, 2004

(65) Prior Publication Data

US 2005/0174171 A1 Aug. 11, 2005

Related U.S. Application Data

(60) Provisional application No. 60/542,282, filed on Feb. 9, 2004.

(51) Int. Cl.
*H03F 3/45* (2006.01)

(52) U.S. Cl. ........................................ 330/69; 330/258

(58) Field of Classification Search .................. 330/69, 330/258, 259, 310, 98, 150
See application file for complete search history.

(56) References Cited

U.S. PATENT DOCUMENTS

| | | | | |
|---|---|---|---|---|
| 4,161,693 | A * | 7/1979 | Carlson | 324/173 |
| 4,472,689 | A * | 9/1984 | Fukushima et al. | 330/306 |
| 5,917,376 | A * | 6/1999 | Ivanov et al. | 330/151 |
| 6,313,704 | B1 * | 11/2001 | Maruyama et al. | 330/259 |

* cited by examiner

*Primary Examiner*—Henry Choe
(74) *Attorney, Agent, or Firm*—William B. Kempler; W. James Brady, III; Frederick J. Telecky, Jr.

(57) ABSTRACT

A technique to attenuate even-order harmonics of an output stage of a multistage nested Miller compensation circuit. In one example embodiment, this is accomplished by using a low-bandwidth low-swing amplifier in the common mode feedback loop to improve the even-order harmonic performance in the signal path. The technique uses a separate multistage loop for the common mode feedback loop to attenuate the even-order harmonics. The common mode feedback loop is the fourth stage and uses the third stage of the nested Miller compensation circuit. The fourth stage of the common mode feedback loop includes a single harmonic and uses a low voltage supply to achieve lower power consumption by the common mode feedback loop.

20 Claims, 3 Drawing Sheets

400

MULTISTAGE COMMON MODE FEEDBACK FOR IMPROVED LINEARITY LINE DRIVERS

This application claims priority under 35 USC § 119 (e) (1) of provisional application No. 60/542,282, Filed on Feb. 9, 2004.

TECHNICAL FIELD OF THE INVENTION

The present invention relates generally to integrated circuits, and more particularly relates to multistage differential amplifiers.

BACKGROUND OF THE INVENTION

Generally, digital line drivers use multistage differential topologies to increase the output signal swing and the power delivered from a single supply. The use of a single differential amplifier helps reduce the area and power required to deliver a larger output signal swing. In such cases, using a very well known and wide spread frequency compensated multistage nested Miller architecture for amplifiers helps improve the odd-harmonic linearity since there are multiple negative feedback loops that correct for the linearity of a class AB output stage.

However, one problem with using the multistage nested Miller architecture is that the output stage not only has odd-order harmonics but also has even-order harmonics. The even-order harmonics contribute to non-linearity. Since the multistage nested Miller architecture uses the differential scheme, the negative feedback loops have no impact on reducing the even-order harmonics. The common-mode feedback amplifier used to set the output common voltage is actually the loop that attenuates the even-order harmonics. The differential scheme helps improve the even-order harmonic performance further. Current solutions for the common mode feedback use a gm/gm amplifier to control the current in the second stage of the differential amplifier which then sets the common mode for the output stage.

The first stage in the differential loop has its own common mode feedback loop. This helps meet the stability requirements of both the common mode loops, but in the process of stabilizing, the first stage makes the gain-bandwidth of the output common mode loop similar to a two stage amplifier. In a three stage differential amplifier the even-order harmonics are attenuated using a two stage amplifier and the odd-order harmonics are attenuated by a three stage amplifier. The line driver's performance in a three stage differential amplifier is limited more by second harmonics than the odd harmonics despite the differential output stage, because the rejection of the even-order harmonics is significantly poor due to large differences in the current in the output stage under a low resistive load. Effectively, the combined rejection of the common mode feedback loop and the differential closed loop is generally not sufficient to reject the even-order harmonics to the same extent as a three stage nested Miller rejection of the odd harmonics.

Therefore, using the multistage differential amplifier for low resistive load applications can result in low second harmonic performance. The first option available to alleviate this problem is to use two single ended amplifiers, but this would significantly increase the power requirement for each of the amplifiers. The second option available is to use three stages in the differential loops for the common mode feedback loop, but this can be a significantly complex solution, since the differential loop is generally designed for handling a complete signal swing and hence can have larger capacitive loads at the internal nodes. The third option available would be to build a very high bandwidth two stage common mode loop to give more attenuation of the even-order harmonics, but this solution can result in requiring significantly more silicon area and power.

SUMMARY OF THE INVENTION

The various embodiments of the present invention provide a technique to attenuate even-order harmonics of the third stage of a multistage nested Miller compensation circuit. In one example embodiment, this is accomplished by keeping both the differential and the common mode feedback circuits as multistage nested Miller amplifiers. The common mode feedback circuit uses two of the differential stages of the nested Miller compensation circuit, thereby reducing the power and the silicon area required for the additional two stages of the common mode feedback circuit.

DETAILED DESCRIPTION OF THE INVENTION

The present subject matter provides a technique to attenuate even-order harmonics of the third stage of a multistage nested Miller compensation circuit. In one example embodiment, this is accomplished by using a separate multistage loop for the common mode feedback loop. The common mode feedback loop is the fourth stage which uses the third stage of the nested Miller compensation circuit to give an effect similar to a third order loop for the attenuation of the even-order harmonics of the third stage.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
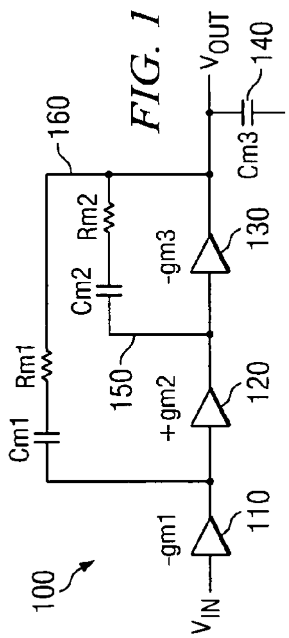
FIG. 1 is a block diagram illustrating a three stage differential amplifier using a multistage nested Miller compensation loop.

FIG. 1 is a block diagram illustrating the operation of a three stage nested Miller differential amplifier 100. The three stage nested Miller differential amplifier 100 shown in FIG. 1 illustrates a first inverting differential amplifier 110, a non-inverting differential amplifier 120, a second inverting differential amplifier 130, inner and outer Miller compensation loops 150 and 160. As shown in FIG. 1, the inner Miller compensation loop 150 includes a capacitor Cm2 and a resistor Rm2 and the outer Miller compensation loop 160 includes a capacitor Cm1 and a resistor Rm1. Also shown in FIG. 1, is a load 140, i.e., a capacitor Cm3, for the final output voltage signal $V_{OUT}$.

In operation, the first inverting differential amplifier 110 receives an input voltage signal $V_{IN}$ and outputs a first amplified signal. The non-inverting differential amplifier 120 then receives the first amplified signal and outputs a second amplified signal. The second inverting differential amplifier 130 receives the second amplified signal and provides the outputs to drive the load. The resistors and capacitors are used to provide the compensation for the Miller differential amplifier 100 to be stable in the closed loop.

Figure 2:
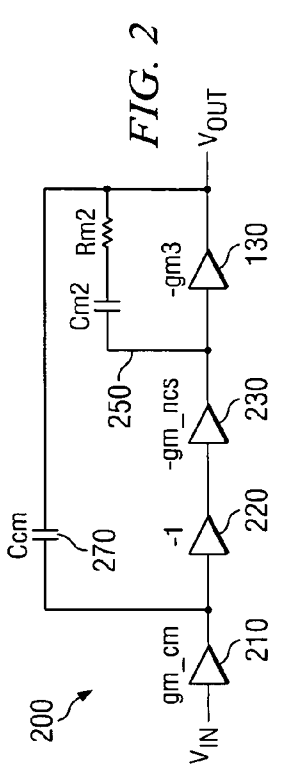
FIG. 2 is a block diagram illustrating an implementation of a common mode feedback loop using the multistage nested Miller compensation loop.

FIG. 2 is a block diagram 200 illustrating the operation of the common mode feedback loop. The block diagram 200 shown in FIG. 2, illustrates a common mode differential amplifier 210, an inverting amplifier 220, stages 230 and 130 and the inner Miller compensation loop 150 (which are part of the differential amplifier shown in FIG. 1), and a compensation capacitor 270. As shown in FIG. 2, the compensation capacitor 270 includes a capacitor Ccm.

In operation, the common mode differential amplifier 210 receives an input voltage signal $V_{IN}$ and uses the common mode feedback loop 200 to output an amplified signal. The inverting amplifier 220 then receives the amplified signal and outputs an inverted signal to provide the polarity for the common mode feedback loop 200 for operating in a negative feedback environment. The stages 230 and 130 then receive the inverted signal and output a voltage signal $V_{OUT}$. The compensation capacitor 270 shown in FIG. 2 is added to the nested Miller loop for stable operation of the common mode feedback loop.

Figure 3:
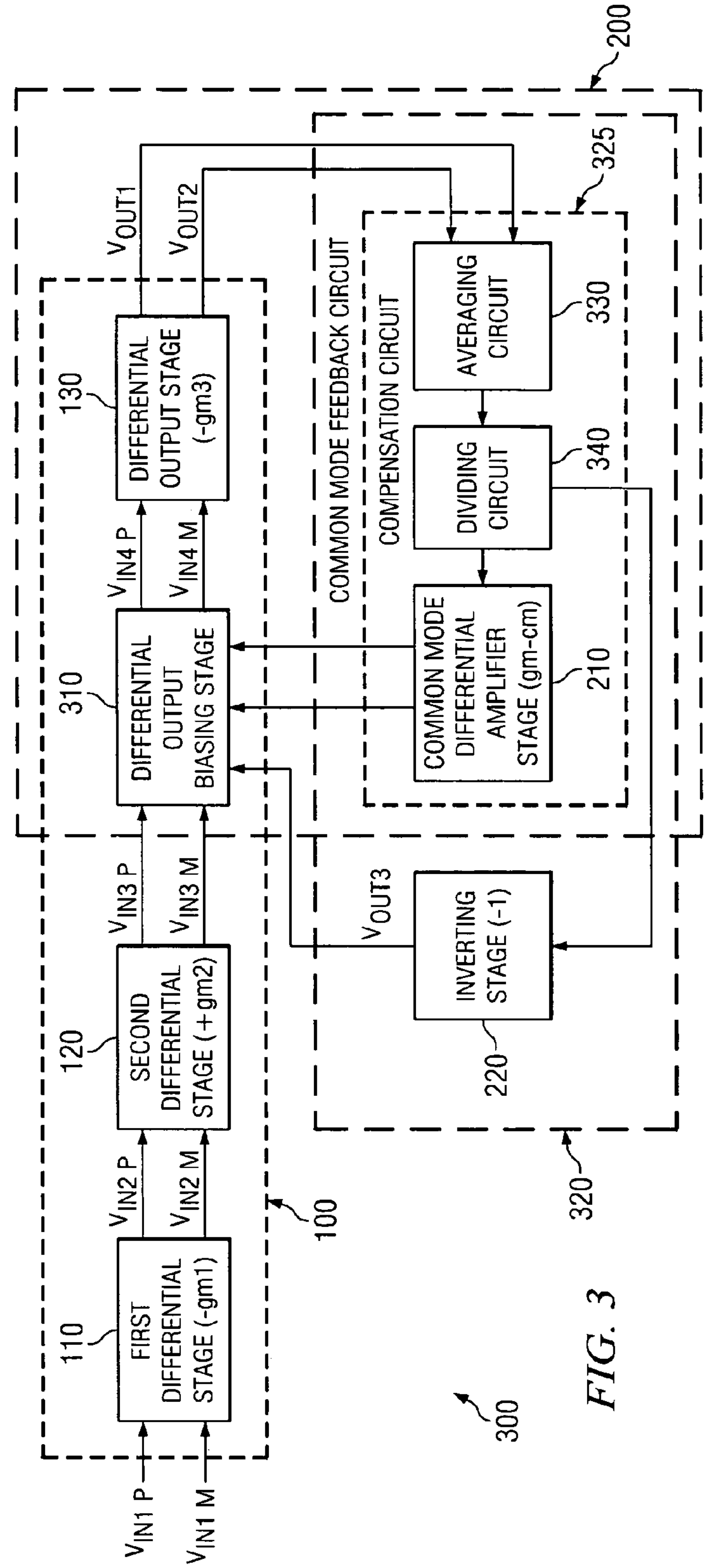
FIG. 3 is a block diagram of an example implementation of a multistage differential amplifier and a common mode feedback loop, using the multistage nested Miller compensation loop shown in FIGS. 1 and 2, according to various embodiments of the present invention.

FIG. 3 is a block diagram 300 illustrating an example operation of the differential amplifier and the common mode feedback loop using the multistage nested Miller compensation loop shown in FIGS. 1 and 2 according to the various embodiments of the present invention. The block diagram 300 shown in FIG. 3 illustrates the differential amplifier 100 shown in FIG. 1 and the common mode feedback loop 200 shown in FIG. 2. As shown in FIG. 3, the differential amplifier 100 includes the first differential stage 110, the second differential stage 120, a differential output biasing stage 310, and the differential output stage 130. Also as shown in FIG. 3, the second differential stage 120 is coupled between the first differential stage 110 and the differential output biasing stage 310. Further the block diagram shown in FIG. 3 illustrates a common mode feedback circuit 320. The differential output stage 130 is coupled between the differential output biasing stage 310 and the common mode feedback circuit 320. Further as shown in FIG. 3, the common mode feedback circuit 320 is coupled to the differential output biasing stage 310. In addition, as shown in FIG. 3 the common mode feedback circuit 320 includes a compensation circuit 325 and the inverting stage 220. Furthermore, as shown in FIG. 3 the compensation circuit 325 includes the common mode amplifier 210, an averaging circuit 330, and a dividing circuit 340.

The various embodiments of the present invention use a separate multi-stage loop for the common mode feedback loop 200, which includes stages 130, 320, and 220, as shown in FIG. 3. The common mode feedback loop 200 is a fourth order loop, but in operation uses the differential output stage 130 and the differential output biasing stage 310 of the multistage differential amplifier 100 and gives an effect similar to a third order loop for the attenuation of the even-order harmonics of the multistage differential amplifier 100. Therefore, as shown in FIG. 3 the last two stages 130 and 310 of the common mode feedback loop 200 are common to both the multistage differential amplifier 100 and the common mode feedback loop 200 and hence require no additional power to operate the last two stages of the common mode feedback loop 200.

Using the last two stages 130 and 310 of the multistage differential amplifier 100 for the common mode feedback loop 200, allows for lower power consumption, lesser silicon area requirement, and a higher linearity performance when used to drive under low resistive loads. The operation of the multistage differential amplifier 100 and the common mode feedback loop 200 are described in more detail with reference to FIGS. 1 and 2, respectively. In some embodiments, the differential output biasing stage 310 receives feedback signal and the second amplified signal and provides predetermined levels of the second amplified signal for the differential output stage.

Figure 4:
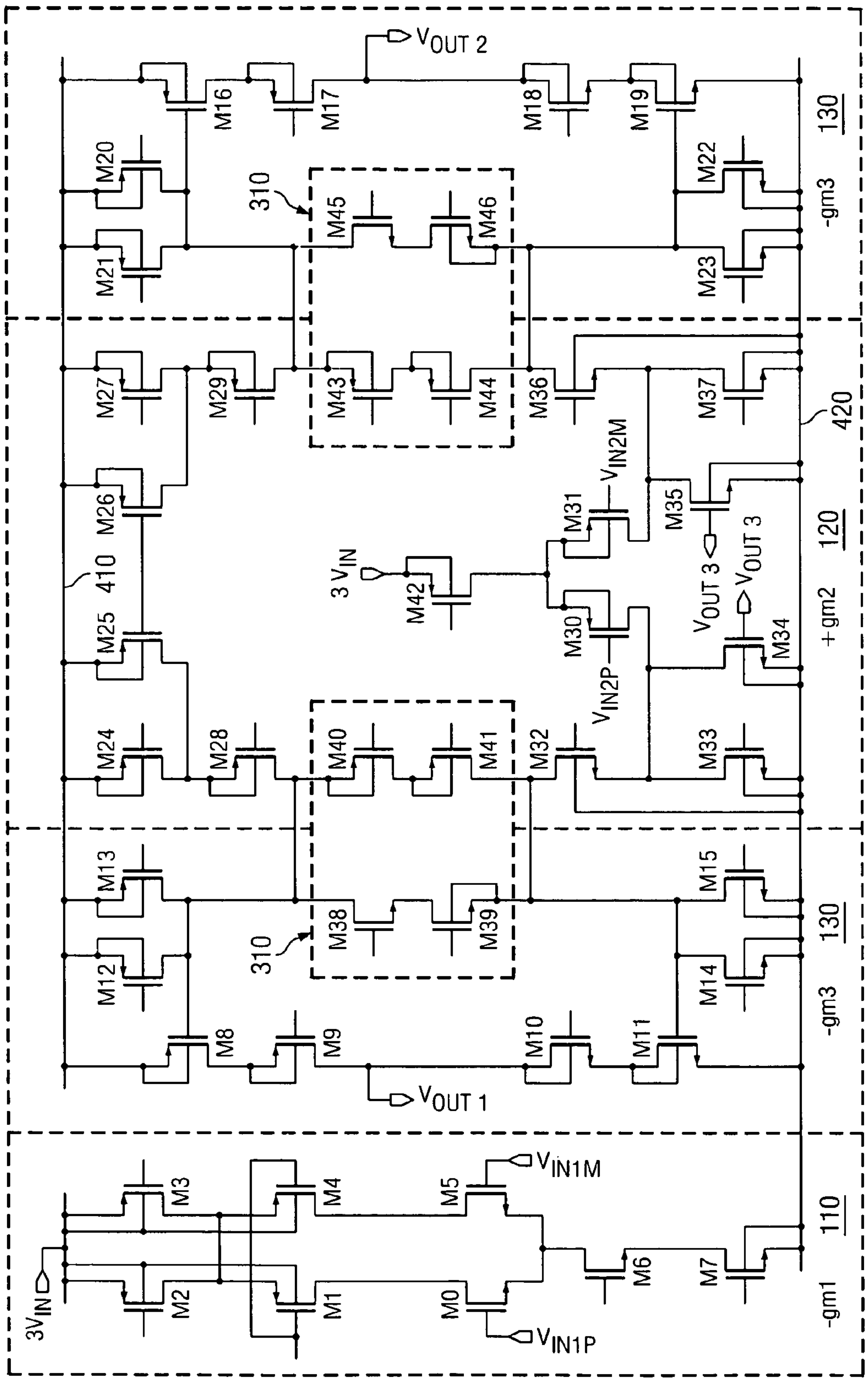
FIGS. 4 and 5 together illustrate an example overall schematic diagram of a realized multistage differential amplifier and the common mode feedback loop using the multistage nested Miller compensation, respectively, shown in FIG. 3.
Figure 5:
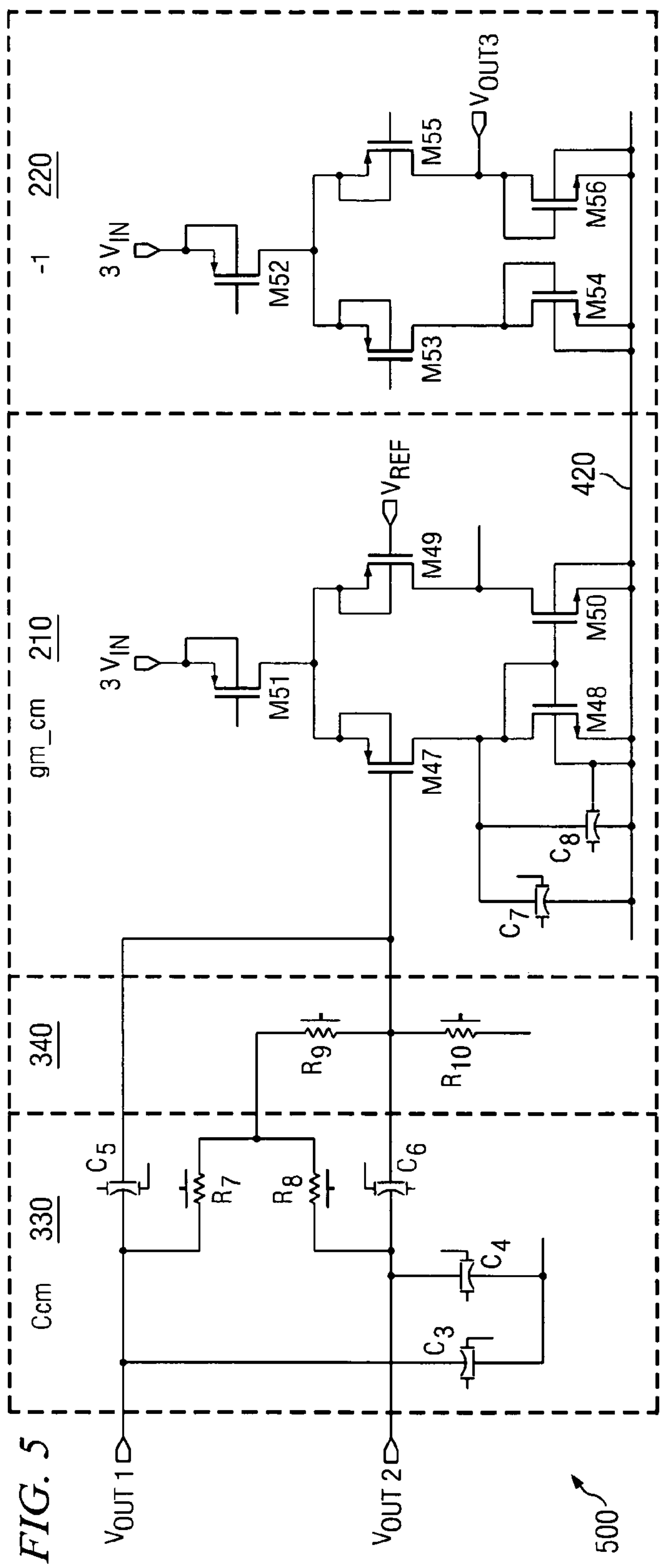

FIGS. 4 and 5 together illustrate an example overall schematic diagram of a realized differential amplifier 400 and common mode feedback loop 500 using the multistage nested Miller compensation, respectively, shown in FIG. 3. In FIGS. 4 and 5, the upper horizontal line 410 would be connected to a source of DC potential serving as the supply voltage, and the lower horizontal line 420 to a reference voltage such as ground. The principle of operation of the realized differential amplifier 400 and the common mode feedback loop 500 are explained in more detail with reference to FIGS. 1, 2, and 3.

FIG. 4 illustrates the first metal-oxide semiconductor (MOS) inverting differential stage 110, which drives the MOS non-inverting differential stage 120, which in-turn drives the second MOS inverting differential stage 130, and which in-turn driven by the differential output biasing stage 310. Two feedback capacitors Cm1 and Cm2 and resistors Rm1 and Rm2 shown in FIG. 1 close the inner and outer loops for nested Miller compensation circuits, respectively. The capacitor Cm3 forms the load for the final output voltage signal $V_{OUT}$ as shown in FIG. 1.

The first MOS inverting differential stage 110 comprises MOS transistors M0–M7 which form a normal differential amplifier to run off of a 3V supply with its own common mode feedback loop. The MOS non-inverting differential stage 120 includes MOS transistors M24–M29, M30–M37, and M42 which form a folded cascode amplifier with an input arm running-off of the 3V supply and has a floating current source for coupling to the second MOS inverting differential stage 130. The second MOS inverting differential stage 130 comprises MOS transistors M8–M15 and M16–M23, which runs off of a 12V supply with a class AB output using drain or non-drain extended transistors as cascode for the output transistor. In these embodimets, the class AB stage refers to a stage that can have both current souce and current sink capabilities that can generally be higher than quiescent current in an output arm so that it is not limited in the current output capabilities. The differential biasing stage 310 comprises MOS transistors M38–M41 and M43–M46.

FIG. 5 illustrates an averaging circuit 330 and a dividing circuit 340. The averaging circuit 330 receives the common mode operating voltage of 6V and divides the averaged operating voltage of 6V using the resistive potential dividing circuit 340 to enable the common mode feedback amplifier stage 210 to run at a lower voltage of 3V. The use of a common mode feedback loop running the stages at a 3V supply provides a low power and high performance solution for the even-order harmonics problem when the multistage differential amplifier is used under low resistive loads. The various embodiments of the present invention use a low-bandwidth low-swing amplifier in the common mode feedback loop to improve the even-order harmonic performance in a signal path.

As shown in FIG. 5, the averaging circuit 330 is formed by using capacitors C3–C6 and resistors R7 and R8. The dividing circuit 340 is formed using resistors R9–R10. Also as shown in FIG. 5 the common mode MOS differential amplifier stage 210 is driven by the dividing circuit 340. The common mode MOS differential amplifier stage 210 shown in FIG. 5 is a gain stage. In addition, FIG. 5 illustrates the MOS inverting stage 220 to provide an inversion to the common mode feedback loop 500 to help achieve the required polarity for the overall feedback and compensation of the common mode feedback loop 500. The last two stages 130 and 310 (shown in FIG. 3) of the common mode feedback loop 500 are part of the differential amplifier 400 and are driven via the output terminal $V_{OUT3}$ to help achieve a very high even-order harmonic performance with very low silicon area and power requirement. The common mode MOS differential amplifier stage 210 includes MOS transistors M47–M51 and the MOS inverting stage 220 comprises MOS transistors M52–M56.

Figure 6:
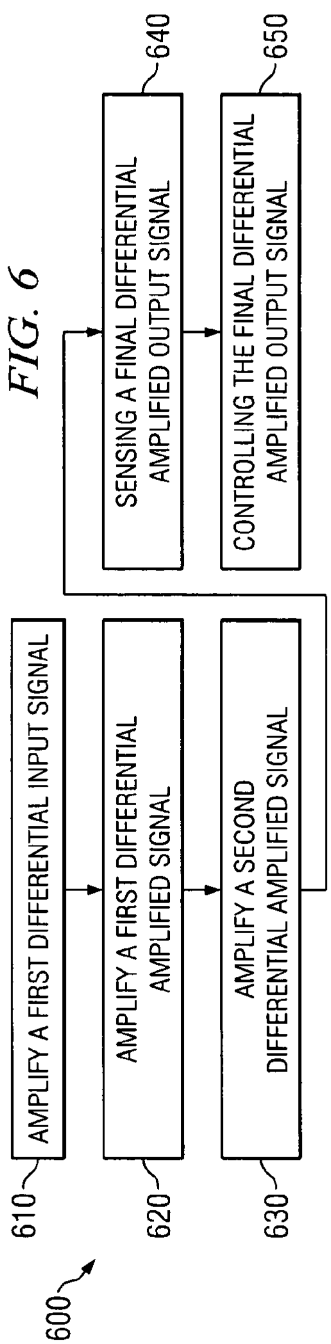
FIG. 6 is a flowchart illustrating an example method of attenuating even-order harmonics of the third stage of the nested Miller compensation circuit shown in FIGS. 3, 4 and 5.

FIG. 6 is a flowchart illustrating an example embodiment of a method 600 of attenuating even-order harmonics of the third stage of the nested Miller compensation circuit according to the various embodiments of the present invention. At 610, the method 600 in this example embodiment receives a first differential input signal $V_{IN}$ and amplifies the received $V_{IN}$ and outputs a first differential amplified signal.

At 620, the first differential amplified signal is amplified and a second differential amplified signal is outputted. At 630, the second differential amplified signal is amplified and a final differential amplified output signal is outputted. At 640, the final differential amplified output signal is sensed. In some embodiments, the sensing of the final differential amplified output signal includes averaging the final differential amplified output signal and outputting an averaged final amplified output signal. The averaged final amplified output signal is then divided and a lower voltage common mode signal is outputted. The lower voltage common mode signal is then amplified and a differential common mode feedback signal is outputted.

At 650, the final differential amplified output signal is controlled to set an average value of the final differential amplified output signal as a function of the sensed final differential amplified output signal to attenuate the even-order harmonics of the third stage of a multistage nested Miller compensation circuit according to embodiments of the present invention. In some embodiments, the final differential amplified output signal is controlled to set an average value of the final differential amplified output signal as a function of the differential common mode feed back signal. In these embodiments, the lower voltage common mode signal is inverted and an inverted lower voltage common mode signal is outputted to help achieve the required polarity for the overall feedback and compensation of the common mode feed back loop. Each of the above acts is explained in more detail with reference to FIGS. 2–5.

Although the method 600 includes acts 610–650 that are arranged serially in the exemplary embodiments, other embodiments of the present subject matter may execute two or more acts in parallel, using multiple processors or a single processor organized in two or more virtual machines or sub-processors. Moreover, still other embodiments may implement the acts as two or more specific interconnected hardware modules with related control and data signals communicated between and through the modules, or as portions of an application-specific integrated circuit. Thus, the exemplary process flow diagrams are applicable to software, firmware, and/or hardware implementations.

The above-described methods and apparatus provide various techniques to attenuate even-order harmonics in a third stage of a multistage nested Miller compensation circuit. It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, a circuit, a system, and an article comprising a machine-accessible medium having associated instructions.

Other embodiments will be readily apparent to those of ordinary skill in the art. The elements, algorithms, and sequence of operations can all be varied to suit particular requirements. The operations described above with respect to the method illustrated in FIG. 6 can be performed in a different order from those shown and described herein.

FIGS. 1–5 are merely representational and are not drawn to scale. Certain proportions thereof may be exaggerated, while others may be minimized. FIGS. 1–6 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A circuit comprising:

a first differential stage having input and output connections;

a second differential stage having input and output connections;

a differential output stage having input and output connections, wherein the second differential stage is connected between the output of the first differential stage and the input of the differential output stage;

a common mode feedback circuit having input and output connections, wherein the differential output stage is connected between the output of the second defferential stage and the input of the common mode feedback circuit, wherein the output of the common mode feedback circuit is connected to the input of the second differential stage; and a differential output biasing stage having input and output connections wherein the differential output biasing stage is connected between the output of the second differential stage and the input of the differential output stage.

2. The circuit of claim 1, wherein the common mode feedback circuit comprises:

an averaging circuit having input and output connections, wherein the output of the differential output stage is coupled to the input of the averaging circuit;

a dividing circuit having input and output connections wherein the output of the averaging circuit is coupled to the input of the dividing circuit;

a common mode amplifier having input and output connections, wherein the input of the common mode amplifier is coupled to the output of the dividing circuit; and an inverting stage having input and output connections, wherein the output of the common mode amplifier is coupled to the input of the inverting stage, and wherein the output of the inverting stage is coupled to the input of the differential output biasing stage.

3. A differential amplifier circuit comprising:

a first differential amplifier having an input and a plurality of output terminals, wherein the input terminal of the first differential amplifier is to couple to an input signal;

a second differential amplifier having a plurality of input and output terminals, wherein the output terminals of the first stage are coupled to the input terminals of the second stage;

a class AB output stage having a plurality of input and output terminals, wherein the output terminals of the second differential amplifier are coupled to the input terminals of the class AB output stage; and a common mode feedback circuit having a plurality of input and output terminals, wherein the output terminals of the class AB output stage are coupled to the input terminals of the common mode feedback circuit, and wherein the output terminals of the common mode feedback circuit are coupled to the input terminals of the class AB output stage, wherein the circuit outputs an amplified signal at the output terminal of the class AB output stage when the input terminals of the first differential amplifier is connected to the input signal.

4. The circuit of claim 3, further comprising:

a differential output biasing stage having a plurality of input and output terminals, wherein the output terminals of the second differential amplifier are coupled to the input terminals of the differential output biasing stage, and wherein the output terminals of the differential output biasing stage are coupled to the input terminals of the class AB output stage.

5. The circuit of claim 4, wherein the common mode feedback circuit comprises;

a compensation circuit having an input terminal and an output terminal, wherein the input terminal of the compensation circuit is coupled to the output terminal of the class AB output stage; and an inverting amplifier having an input terminal and an output terminals, wherein the input terminal of the inverting amplifier is coupled to the output terminal of the compensation circuit and the output terminal of the inverting amplifier is coupled to the input terminals of the differential output biasing stage.

6. The circuit of claim 5, wherein the compensation circuit comprises:

an averaging circuit including a plurality of input and output terminals, wherein the output terminals of the class AB output stage are coupled to the input terminals of the averaging circuit;

a dividing circuit including a plurality of input and output terminals, wherein the output terminals of the averaging circuit are coupled to the input terminals of the dividing circuit; and a common mode differential amplifier having a plurality of input and output terminals, wherein the input of the common mode differential amplifier are coupled to the output terminals of the dividing circuit.

7. The circuit of claim 6, wherein the averaging circuit receives output signals from the class AB output stage and averages the received output signal using two resistors and outputs an averaged signal.

8. The circuit of claim 7, wherein the dividing circuit includes a potential divider to divide the averaged signal.

9. The circuit of claim 6, wherein the first and second differential amplifiers and the class AB output stages comprise transistors.

10. A multistage amplifier circuit comprising:

a first inverting differential amplifier having an input terminal, to couple to an input signal, and an output terminal;

a non-inverting differential amplifier having an input terminal and an output terminal, wherein the output terminal of the first inverting differential amplifier is connected to the input terminal of the non-inverting differential amplifier;

a second inverting differential amplifier having an input terminal and an output terminal, wherein the output terminal of the non-inverting differential amplifier is connected to the input terminal of the second inverting differential amplifier;

a first outer loop Miller compensation circuit coupled between the output terminal of the second inverting differential amplifier and the input terminal of the non-inverting differential amplifier;

a second outer loop Miller compensation circuit coupled across the input and output terminals of the second inverting differential amplifier;

a common mode differential amplifier having an input terminal and an output terminal, wherein the input terminal to couple to receive a voltage signal;

a third inverting differential amplifier having an input terminal and an output terminal, wherein the output terminal of the common mode differential amplifier is coupled to the input terminal of the third inverting differential amplifier, wherein the output terminal of the third inverting differential amplifier is coupled to the input terminal of the second inverting differential amplifier;

an inner loop common mode feedback circuit coupled across the input terminal and the outer terminal of the second inverting differential amplifier; and a compensation circuit coupled across the output terminal of the second inverting differential amplifier and the input terminal of the third inverting differential amplifier.

11. The circuit of claim 10, wherein the compensation circuit comprises:

an averaging circuit including a plurality of input and output terminals, wherein the output terminals of the second inverting differential amplifier are coupled to the input terminals of the averaging circuit; and a dividing circuit including a plurality of input and output terminals, wherein the output terminals of the averaging circuit are coupled to the input terminals of the dividing circuit, wherein the input terminals of the common mode differential amplifier are coupled to the output terminals of the dividing circuit.

12. The circuit of claim 11 further comprising:

a differential output biasing stage having input and output terminals, wherein the input terminal of the differential output biasing stage is coupled to the output terminal of the third inverting differential amplifier and the output terminal of the differential output biasing stage is coupled to the input terminal of the second inverting differential amplifier.

13. The circuit of claim 12, wherein the differential output biasing stage is a class AB biasing stage.

14. The circuit of claim 13, wherein the common mode differential amplifier is a class AB output stage.

15. An apparatus including a differential amplifier with multistage loop for common mode feedback comprising:

a first differential amplifier means for receiving a feedback signal, receiving and amplifying a first input signal and providing a first amplified signal;

a second differential amplifier means for receiving and further amplifying the first amplified signal and providing a second amplified signal;

a differential output means for receiving a second input signal and the second amplified signal and providing a class AB signal output using drain extended transistors;

a common mode feedback means for averaging the class AB signal and amplifying the class AB signal and providing the feedback signal; and a differential output biasing means for receiving the feedback signal and the second amplified signal and providing predetermined levels of the second amplified signal for the differential output means.

16. The apparatus of claim 15, wherein the common mode feedback means comprises:

an averaging means for receiving the class AB signal and providing an averaged signal;

a dividing means for receiving the averaged signal and outputting divided signals; and a common mode amplifier means for receiving the divided signals and providing amplified divided signals.

17. The apparatus of claim 15, further comprising:

an inverting means to provide an inverted feedback signal.

18. A method comprising:

amplifying a first differential input signal and outputting a first differential amplified signal;

amplifying the first differential amplified signal and outputting a second differential amplified signal;

amplifying the second differential amplified signal and outputting a final differential amolified output signal;

sensing the final differential amplified output signal; and controlling the final differential amplified output signal to set an average value of the final differential amplified output signal as a function of the sensed final differential amplified output signal, wherein sensing the final amplified output signal comprises:

averaging the final differential amplified output signal and outputting an averaged final amplified output signal;

dividing the averaged final amplified output signal and outputting a lower voltage common mode signal; and amplifying the lower voltage common mode signal and outputting a differential common mode feedback signal.

19. The method of claim 18, wherein controlling the final differential amplified output signal comprises:

controlling the final differential amplified output signal to set an average value of the final differential amplified output signal as a function of the differential common mode feedback signal.

20. The method of claim 18, further comprising:

Inverting the lower voltage common mode signal and outputting an inverted lower voltage common mode signal.

* * * * *